(12) United States Patent
Ni et al.

(10) Patent No.: US 11,619,887 B2
(45) Date of Patent: Apr. 4, 2023

(54) ASSEMBLY FOR COLLIMATING BROADBAND RADIATION

(71) Applicant: ASML NETHERLANDS B.V., Veldhoven (NL)

(72) Inventors: Yongfeng Ni, Waalre (NL); Ronald Franciscus Herman Hugers, Best (NL); Andreas Johannes Antonius Brouns, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 291 days.

(21) Appl. No.: 16/995,993

(22) Filed: Aug. 18, 2020

(65) Prior Publication Data

US 2021/0063900 A1 Mar. 4, 2021

(30) Foreign Application Priority Data

Sep. 3, 2019 (EP) ..................................... 19195038
Sep. 16, 2019 (EP) ..................................... 19197449

(51) Int. Cl.
*G03F 9/00* (2006.01)
*G03F 7/20* (2006.01)
(Continued)

(52) U.S. Cl.
CPC ........... *G03F 9/7026* (2013.01); *G02B 7/023* (2013.01); *G02B 7/026* (2013.01); *G02B 27/30* (2013.01);
(Continued)

(58) Field of Classification Search
CPC .. G03F 9/7026; G03F 7/70625; G03F 7/7065; G03F 7/70566; G03F 7/70616;
(Continued)

(56) References Cited

U.S. PATENT DOCUMENTS 6,952,253 B2 10/2005 Lof et al.
2004/0149037 A1 8/2004 Digonnet et al.
(Continued)

FOREIGN PATENT DOCUMENTS

EP 1081521 3/2001
EP 1628164 2/2006
(Continued)

OTHER PUBLICATIONS

Extended European Search Report issued in corresponding European patent Application No. 19197449.2, dated Mar. 2, 2020.
(Continued)

*Primary Examiner* — James C. Jones
(74) *Attorney, Agent, or Firm* — Pillsbury Winthrop Shaw Pittman, LLP (57) ABSTRACT

An assembly for collimating broadband radiation, the assembly including: a convex refractive singlet lens having a first spherical surface for coupling the broadband radiation into the lens and a second spherical surface for coupling the broadband radiation out of the lens, wherein the first and second spherical surfaces have a common center; and a mount for holding the convex refractive singlet lens at a plurality of contact points having a centroid coinciding with the common center.

21 Claims, 6 Drawing Sheets

(51) Int. Cl.
*G02B 7/02* (2021.01)
*G02B 27/30* (2006.01)
(52) U.S. Cl.
CPC ........ *G03F 7/7065* (2013.01); *G03F 7/70625* (2013.01); *G03F 7/70566* (2013.01)
(58) Field of Classification Search
CPC ........ G02B 7/023; G02B 7/026; G02B 27/30; G02B 3/00; G01N 2201/0633; G01N 21/9501
See application file for complete search history.

(56) References Cited

U.S. PATENT DOCUMENTS

| | | |
|---|---|---|
| 2005/0063049 A1 | 3/2005 | Steenblik et al. |
| 2007/0224518 A1 | 9/2007 | Yokhin et al. |
| 2007/0296960 A1 | 12/2007 | Den Boef et al. |
| 2008/0198380 A1 | 8/2008 | Straaijer et al. |
| 2009/0168062 A1 | 7/2009 | Straaijer |
| 2010/0007863 A1 | 1/2010 | Jordanoska |
| 2010/0265492 A1* | 10/2010 | Schroeder ............ G01J 3/0208 356/326 |
| 2010/0328655 A1 | 12/2010 | Den Boef |
| 2011/0026032 A1 | 2/2011 | Den Boef et al. |
| 2011/0032500 A1 | 2/2011 | Straaijer |
| 2011/0102753 A1 | 5/2011 | Van De Kerkhof et al. |
| 2011/0102793 A1 | 5/2011 | Straaijer |
| 2011/0188020 A1 | 8/2011 | Den Boef |
| 2011/0249244 A1 | 10/2011 | Leewis et al. |
| 2012/0044470 A1 | 2/2012 | Smilde et al. |
| 2012/0044495 A1 | 2/2012 | Straaijer |
| 2013/0304424 A1 | 11/2013 | Bakeman et al. |
| 2013/0308142 A1 | 11/2013 | Straaijer |
| 2014/0019097 A1 | 1/2014 | Bakeman et al. |
| 2016/0161863 A1 | 6/2016 | Den Boef et al. |
| 2016/0282282 A1 | 9/2016 | Quintanilha et al. |
| 2016/0370717 A1 | 12/2016 | Den Boef et al. |
| 2017/0184981 A1 | 6/2017 | Quintanilha et al. |

FOREIGN PATENT DOCUMENTS

| | | |
|---|---|---|
| GB | 2489554 | 10/2012 |
| WO | 2011012624 | 2/2011 |

OTHER PUBLICATIONS

Dr. R. Jedamzik; "Color correction in optical systems or why optical design needs fluoro-phosphate glasses", Schott Advanced Optics, URL: www.schott.com/advanced_optics/english/download/schott-fluoro-phosphate-glasses-may-2014.pdf (May 2014).

Lemaillet, P. et al: "Intercomparison between optical and X-ray scatterometry measurements of FinFET structures", Proc. of SPIE, vol. 8681 2013.

Extended European Search Report and Written Opinion issued in corresponding European Patent Application No. 20189296.5, dated Nov. 24, 2020.

* cited by examiner

ASSEMBLY FOR COLLIMATING BROADBAND RADIATION

This application claims the benefit of priority of European patent application no. 19195038.5, filed Sep. 3, 2019, and of European patent application no. 19197449.2, filed Sep. 16, 2019, each of the foregoing applications is incorporated herein in its entirety by reference.

FIELD

The present description relates to assemblies, apparatuses, and methods for radiation. In particular, it relates to an assembly for collimating broadband radiation.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") at a patterning device (e.g., a mask) onto a layer of radiation-sensitive material (resist) provided on a substrate (e.g., a wafer).

To project a pattern on a substrate a lithographic apparatus may use electromagnetic radiation. The wavelength of this radiation determines the minimum size of features which can be formed on the substrate. Typical wavelengths currently in use are 365 nm (i-line), 248 nm, 193 nm and 13.5 nm. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

Low-$k_1$ lithography may be used to process features with dimensions smaller than the classical resolution limit of a lithographic apparatus. In such a process, the resolution formula may be expressed as $CD=k_1 \times \lambda/NA$, where $\lambda$ is the wavelength of radiation employed, NA is the numerical aperture of the projection optics in the lithographic apparatus, CD is the "critical dimension" (generally the smallest feature size printed, but in this case half-pitch) and $k_1$ is an empirical resolution factor. In general, the smaller $k_1$ the more difficult it becomes to reproduce the pattern on the substrate that resembles the shape and dimensions planned by a circuit designer in order to achieve particular electrical functionality and performance. To overcome these difficulties, sophisticated fine-tuning steps may be applied to the lithographic projection apparatus and/or design layout. These include, for example, but not limited to, optimization of NA, customized illumination schemes, use of phase shifting patterning devices, various optimization of the design layout such as optical proximity correction (OPC, sometimes also referred to as "optical and process correction") in the design layout, or other methods generally defined as "resolution enhancement techniques" (RET). Alternatively, tight control loops for controlling a stability of the lithographic apparatus may be used to improve reproduction of the pattern at low k1.

SUMMARY

In order to verify the quality of a lithographic patterning process and/or control the settings, aspects of the process may be measured. For example, measurements may be taken of a substrate comprising lithographically exposed patterns, at different stages throughout the patterning process. Measurements may be obtained using radiation, such as electromagnetic radiation. Due to the small dimensions of the patterned features, the properties of the radiation used for inspecting a pattern may affect what kind of characteristics can be observed and measured by the radiation. For example, the amount of detail and the smallest size feature that may be observed by a metrology tool may depend on the wavelength(s) of the radiation. One or more other properties that may affect the quality of measurements include for example shape, size, power, etc. of the radiation beam. Increasing the amount of control a metrology apparatus has over one or more properties of radiation used for measuring a pattern, may increase the quality and amount of information obtained from the measurements. An optical assembly may be used to control a radiation beam. Optical control of radiation may be more difficult to implement for radiation comprising a broader range of wavelengths. This may in some cases be addressed by adding additional elements to the optical assembly. However, adding complexity (e.g. more optical elements) to an optical assembly may increase the amount of losses in the assembly, it may add alignment challenges, and/or can increase the cost of the assembly. It is therefore of interest to control radiation using an optical assembly with reduced complexity.

According to an aspect of the disclosure, there is provided an assembly for collimating broadband radiation. The assembly comprises a convex refractive singlet lens having a first spherical surface for coupling the broadband radiation into the lens, and a second spherical surface for coupling collimated broadband radiation out of the lens. The first and second spherical surfaces have a common center. The assembly further comprises a mount for holding the convex refractive singlet lens at a plurality of contact points having a centroid coinciding with the common center.

Optionally, the convex refractive singlet lens may have a substantially spherical shape.

Optionally, the convex refractive singlet lens may comprise a low dispersion material.

Optionally, the low dispersion material may have an Abbe number above 80.

Optionally, the low dispersion material may be N-FK58 glass.

Optionally, the convex refractive singlet may comprise an anti-reflection coating.

Optionally, the mount may be a kinematic mount.

Optionally, the kinematic mount may contact the singlet lens at a plurality of contact points.

Optionally, the singlet lens may be positioned inside the mount such that a centroid of the contact points of the kinematic mount coincides with the center of the first and second spherical lens surfaces.

Optionally, the mount may contact the singlet lens in an equatorial plane of the singlet lens.

Optionally, the mount may comprise a plurality of leaf spring contacts urged into contact with the singlet lens.

Optionally, the kinematic mount may contact the singlet lens at three locations.

Optionally, the assembly may further comprise a coupling refractive lens for coupling the collimated broadband radiation into a fiber.

Optionally, the coupling refractive lens may comprise an anti-reflection coating.

Optionally, the coupling refractive lens may be a chromatic doublet lens.

Optionally, the chromatic doublet lens may have a front lens element for coupling the broadband radiation into the lens, and a back lens element for coupling the broadband radiation out of the lens.

Optionally, the front lens element may comprise N-LAK7 glass, and the back lens element may comprise SF6 glass.

Optionally, the front lens element may have a biconvex shape. The back lens element may have a positive meniscus shape.

Optionally, the front lens element and the back lens element of the chromatic doublet lens may be attached to each other with an adhesive.

Optionally, the coupling efficiency into the fiber may be >80%.

Optionally, the broadband radiation may be received from a fiber output.

Optionally, the broadband radiation may comprise supercontinuum radiation.

Optionally, the broadband radiation may comprise radiation with wavelengths in the range of 400 nm to 2400 nm.

Optionally, the broadband radiation may comprise radiation with wavelengths in the range of 500 nm to 900 nm.

Optionally, the broadband radiation coupled into the lens may comprise peak powers between 50 W and 500 W.

Optionally, the broadband radiation may comprise pulsed radiation.

According to a further aspect of the disclosure, there is provided an assembly for coupling broadband radiation into a fiber. The assembly comprises a first lens for collimating the broadband radiation, and a second chromatic doublet lens for coupling the collimated broadband radiation into a fiber. The first lens has first dispersive properties that cause chromatic dispersion in the broadband radiation, and the second lens has second dispersive properties coupled to the dispersive properties of the first lens. The second dispersive properties are configured to correct at least a portion of the chromatic dispersion caused by the first lens.

Optionally, the first lens may be a singlet lens.

Optionally, the singlet lens may have a spherical shape.

Optionally, the first lens may be designed to optimize the dispersive properties for radiation in the range of 500 nm to 900 nm.

According to a further aspect of the disclosure, there is provided a radiation source comprising an assembly as described herein, a broadband radiation source for providing radiation to the assembly, and a fiber for collecting and outputting radiation.

According to a further aspect of the disclosure, there is provided a method of collimating broadband radiation. The method may comprise providing a convex refractive singlet lens having a first spherical surface for coupling the broadband radiation into the lens and a second spherical surface for coupling collimated broadband radiation out of the lens, wherein the first and second spherical surfaces have a common center. The method may further comprise mounting the convex refractive singlet lens in a kinematic mount, and directing broadband or radiation from a source into the first spherical surface of the convex refractive singlet lens.

According to a further aspect of the disclosure, there is provided a metrology apparatus comprising an assembly as described herein.

According to a further aspect of the disclosure, there is provided an inspection apparatus comprising an assembly as described herein.

According to a further aspect of the disclosure, there is provided a lithographic apparatus comprising an assembly as described herein.

According to a further aspect of the disclosure, there is provided a convex refractive singlet lens having a first spherical surface for coupling broadband radiation into the lens and a second spherical surface for coupling broadband radiation out of the lens, wherein the first and second spherical surfaces have a common center, and wherein the lens comprises a low dispersion refractive material having an Abbe number above 80.

BRIEF DESCRIPTION OF THE DRAWINGS

Embodiments of the invention will now be described, by way of example only, with reference to the accompanying schematic drawings, in which.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
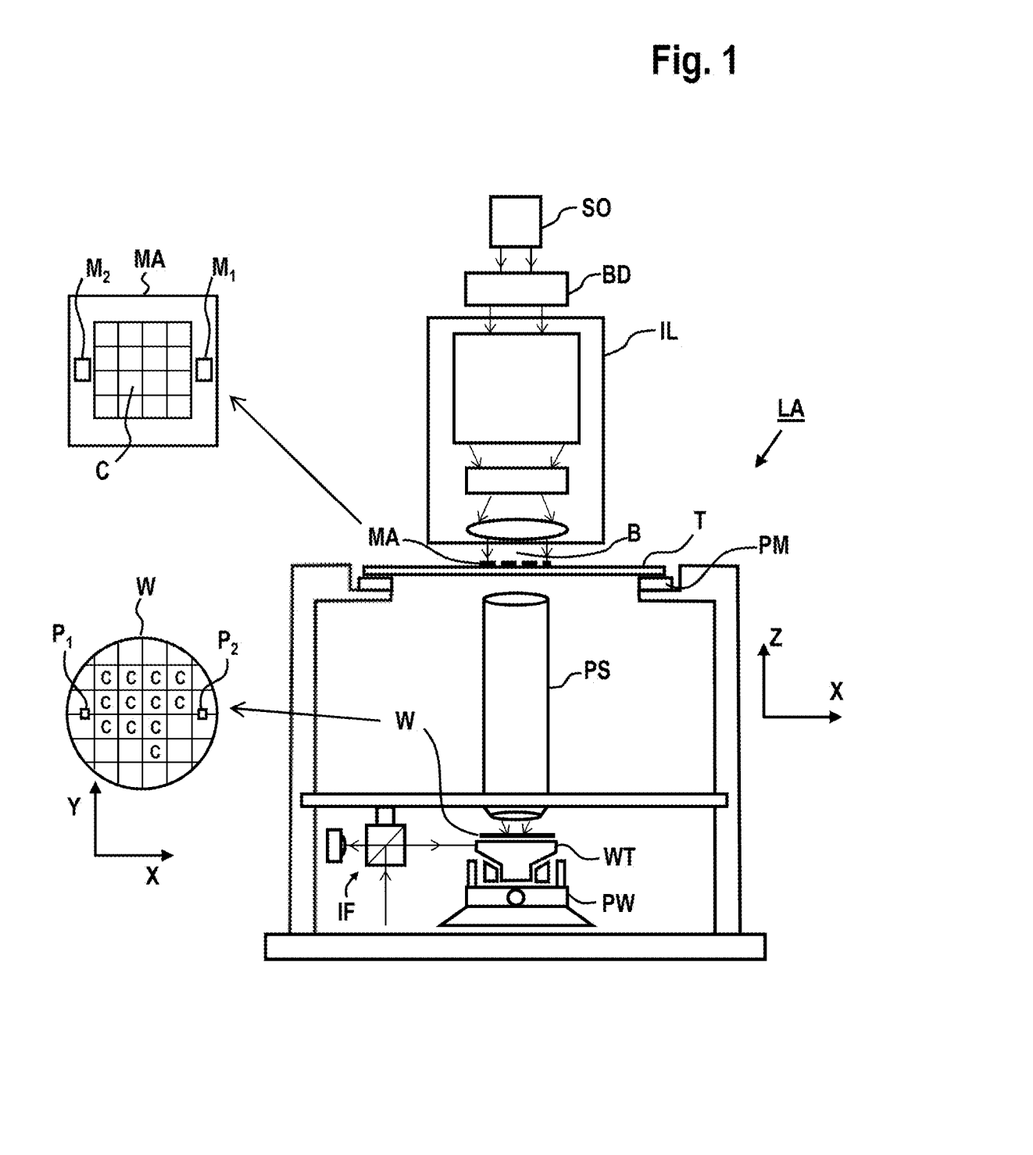
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) T constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein in its entirety by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support T, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

Figure 2:
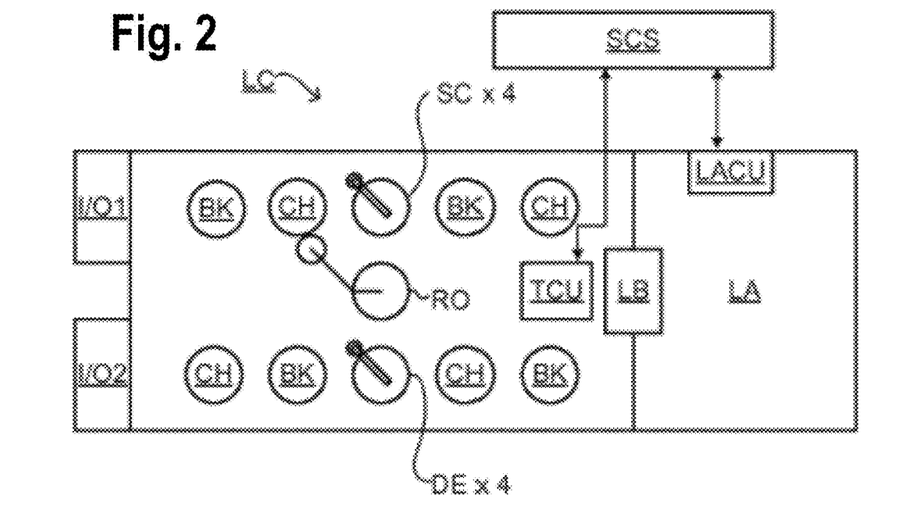
FIG. 2 depicts a schematic overview of a lithographic cell.

As shown in FIG. 2 the lithographic apparatus LA may form part of a lithographic cell LC, also sometimes referred to as a lithocell or (litho)cluster, which often also includes apparatus to perform pre- and post-exposure processes on a substrate W. Conventionally these include spin coaters SC to deposit resist layers, developers DE to develop exposed resist, chill plates CH and bake plates BK, e.g. for conditioning the temperature of substrates W e.g. for conditioning solvents in the resist layers. A substrate handler, or robot, RO picks up substrates W from input/output ports I/O1, I/O2, moves them between the different process apparatus and delivers the substrates W to the loading bay LB of the lithographic apparatus LA. The devices in the lithocell, which are often also collectively referred to as the track, are typically under the control of a track control unit TCU that in itself may be controlled by a supervisory control system SCS, which may also control the lithographic apparatus LA, e.g. via lithography control unit LACU.

In order for the substrates W exposed by the lithographic apparatus LA to be exposed correctly and consistently, it is desirable to inspect substrates to measure properties of patterned structures, such as overlay errors between subsequent layers, line thicknesses, critical dimensions (CD), etc. For this purpose, inspection tools (not shown) may be included in the lithocell LC. If errors are detected, adjustments, for example, may be made to exposures of subsequent substrates or to other processing steps that are to be performed on the substrates W, especially if the inspection is done before other substrates W of the same batch or lot are still to be exposed or processed.

An inspection apparatus, which may also be referred to as a metrology apparatus, is used to determine properties of the substrates W, and in particular, how properties of different substrates W vary or how properties associated with different layers of the same substrate W vary from layer to layer. The inspection apparatus may alternatively be constructed to identify defects on the substrate W and may, for example, be part of the lithocell LC, or may be integrated into the lithographic apparatus LA, or may even be a stand-alone device. The inspection apparatus may measure the properties on a latent image (image in a resist layer after the exposure), or on a semi-latent image (image in a resist layer after a post-exposure bake step PEB), or on a developed resist image (in which the exposed or unexposed parts of the resist have been removed), or even on an etched image (after a pattern transfer step such as etching).

Figure 3:
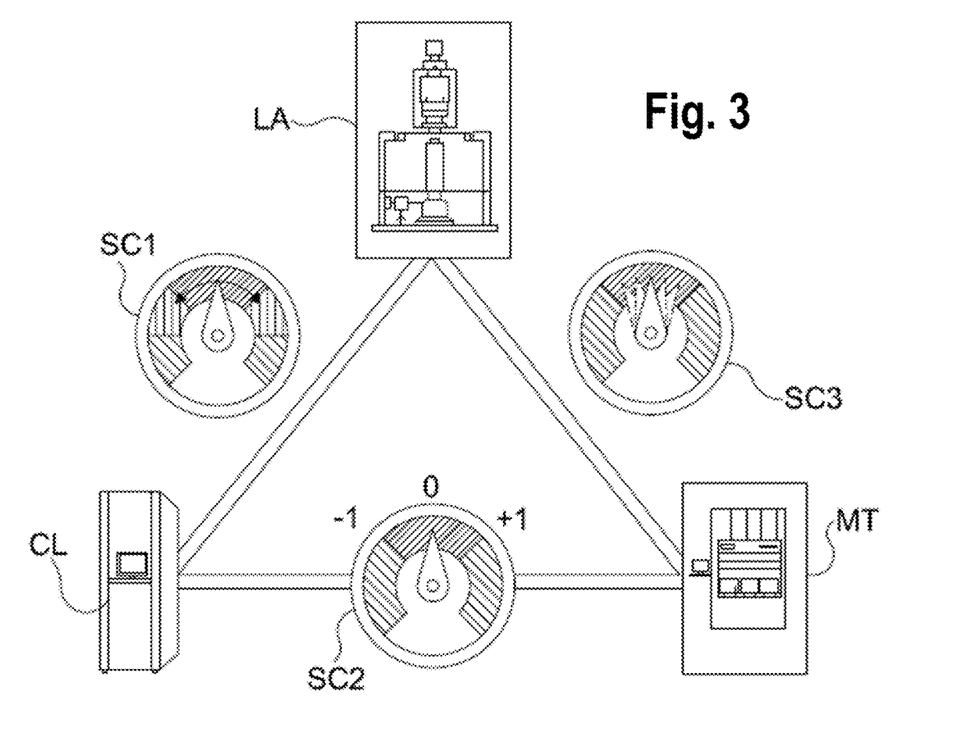
FIG. 3 depicts a schematic representation of holistic lithography, representing a cooperation between three technologies to optimize semiconductor manufacturing.

Typically the patterning process in a lithographic apparatus LA is one of the most critical steps in the processing which requires high accuracy of dimensioning and placement of structures on the substrate W. To ensure this high accuracy, three systems may be combined in a so called "holistic" control environment as schematically depicted in FIG. 3. One of these systems is the lithographic apparatus LA which is (virtually) connected to a metrology tool MT (a second system) and to a computer system CL (a third system). The key of such "holistic" environment is to optimize the cooperation between these three systems to enhance the overall process window and provide tight control loops to ensure that the patterning performed by the lithographic apparatus LA stays within a process window. The process window defines a range of process parameters (e.g. dose, focus, overlay) within which a specific manufacturing process yields a defined result (e.g. a functional semiconductor device)—typically within which the process parameters in the lithographic process or patterning process are allowed to vary.

The computer system CL may use (part of) the design layout to be patterned to predict which resolution enhancement techniques to use and to perform computational lithography simulations and calculations to determine which mask layout and lithographic apparatus settings achieve the largest overall process window of the patterning process (depicted in FIG. 3 by the double arrow in the first scale SC1). Typically, the resolution enhancement techniques are arranged to match the patterning possibilities of the lithographic apparatus LA. The computer system CL may also be used to detect where within the process window the lithographic apparatus LA is currently operating (e.g. using input from the metrology tool MT) to predict whether defects may be present due to e.g. sub-optimal processing (depicted in FIG. 3 by the arrow pointing "0" in the second scale SC2).

The metrology tool MT may provide input to the computer system CL to enable accurate simulations and predictions, and may provide feedback to the lithographic apparatus LA to identify possible drifts, e.g. in a calibration status of the lithographic apparatus LA (depicted in FIG. 3 by the multiple arrows in the third scale SC3).

In lithographic processes, it is desirable to make frequently measurements of the structures created, e.g., for process control and verification. Tools to make such measurement are typically called metrology tools MT. Different types of metrology tools MT for making such measurements are known, including scanning electron microscopes or various forms of scatterometer metrology tools MT. Scatterometers are versatile instruments which allow measurements of the parameters of a lithographic process by having a sensor in the pupil or a conjugate plane with the pupil of the objective of the scatterometer, measurements usually referred as pupil based measurements, or by having the sensor in the image plane or a plane conjugate with the image plane, in which case the measurements are usually referred as image or field based measurements. Such scatterometers and the associated measurement techniques are further described in U.S. patent application publication nos. US20100328655, US2011102753A1, US20120044470A, US20110249244, US20110026032 and European patent application publication no. EP1,628,164, each of the foregoing patent application publications incorporated herein in its entirety by reference. Aforementioned scatterometers may measure gratings using radiation from soft x-ray and visible to near-IR wavelength range.

In a first embodiment, the scatterometer MT is an angular resolved scatterometer. In such a scatterometer reconstruction methods may be applied to the measured signal to reconstruct or calculate properties of the grating. Such reconstruction may, for example, result from simulating interaction of scattered radiation with a mathematical model of the target structure and comparing the simulation results with those of a measurement. Parameters of the mathematical model are adjusted until the simulated interaction produces a diffraction pattern similar to that observed from the real target.

In a second embodiment, the scatterometer MT is a spectroscopic scatterometer MT. In such spectroscopic scatterometer MT, the radiation emitted by a radiation source is directed onto the target and the reflected or scattered radiation from the target is directed to a spectrometer detector, which measures a spectrum (i.e. a measurement of intensity as a function of wavelength) of the specular reflected radiation. From this data, the structure or profile of the target giving rise to the detected spectrum may be reconstructed, e.g. by Rigorous Coupled Wave Analysis and non-linear regression or by comparison with a library of simulated spectra.

In a third embodiment, the scatterometer MT is an ellipsometric scatterometer. The ellipsometric scatterometer allows for determining parameters of a lithographic process by measuring scattered radiation for each polarization state. Such metrology apparatus emits polarized radiation (such as linear, circular, or elliptic) by using, for example, appropriate polarization filters in the illumination section of the metrology apparatus. A source suitable for the metrology apparatus may provide polarized radiation as well. Various embodiments of existing ellipsometric scatterometers are described in U.S. patent application publication nos. 2007-0296960, 2008-0198380, 2009-0168062, 2010-0007863, 2011-0032500, 2011-0102793, 2011-0188020, 2012-0044495, 2013-0162996 and 2013-0308142, each of which is incorporated herein in its entirety by reference.

Examples of known scatterometers often rely on provision of dedicated metrology targets, such as underfilled targets (a target, in the form of a simple grating or overlapping gratings in different layers, that is large enough that a measurement beam generates a spot that is smaller than the grating) or overfilled targets (whereby the illumination spot partially or completely contains the target). Further, the use of metrology tools, for example an angular resolved scatterometer illuminating an underfilled target, such as a grating, allows the use of so-called reconstruction methods where the properties of the grating can be calculated by simulating interaction of scattered radiation with a mathematical model of the target structure and comparing the simulation results with those of a measurement. Parameters of the model are adjusted until the simulated interaction produces a diffraction pattern similar to that observed from the real target.

In one embodiment of the scatterometer MT, the scatterometer MT is adapted to measure the overlay of two misaligned gratings or periodic structures by measuring asymmetry in the reflected spectrum and/or the detection configuration, the asymmetry being related to the extent of the overlay. The two (typically overlapping) grating structures may be applied in two different layers (not necessarily consecutive layers), and may be formed substantially at the same position on the wafer. The scatterometer may have a symmetrical detection configuration as described e.g. in European patent application publication no. EP1,628,164, incorporated herein in its entirety by reference, such that any asymmetry is clearly distinguishable. This provides a straightforward way to measure misalignment in gratings. Further examples for measuring overlay error between the two layers containing periodic structures as target is measured through asymmetry of the periodic structures may be found in PCT patent application publication no. WO 2011/012624 and U.S. patent application publication no. US 2016-0161863, each incorporated herein in its entirety by reference.

Other parameters of interest may be focus and dose. Focus and dose may be determined simultaneously by scatterometry (or alternatively by scanning electron microscopy) as described in U.S. patent application publication no. US2011-

0249244, incorporated herein in its entirety by reference. A single structure may be used which has a unique combination of critical dimension and sidewall angle measurements for each point in a focus energy matrix (FEM—also referred to as Focus Exposure Matrix). If these unique combinations of critical dimension and sidewall angle are available, the focus and dose values may be uniquely determined from these measurements.

A metrology target may be an ensemble of composite gratings, formed by a lithographic process, mostly in resist, but also after an etch process for example. Typically the pitch and line-width of the structures in the gratings strongly depend on the measurement optics (in particular the NA of the optics) to be able to capture diffraction orders coming from the metrology targets. As indicated earlier, the diffracted signal may be used to determine shifts between two layers (also referred to 'overlay') or may be used to reconstruct at least part of the original grating as produced by the lithographic process. This reconstruction may be used to provide guidance of the quality of the lithographic process and may be used to control at least part of the lithographic process. Targets may have smaller sub-segmentation, which are configured to mimic dimensions of the functional part of the design layout in a target. Due to this sub-segmentation, the targets will behave more similar to the functional part of the design layout such that the overall process parameter measurements resemble the functional part of the design layout better. The targets may be measured in an underfilled mode or in an overfilled mode. In the underfilled mode, the measurement beam generates a spot that is smaller than the overall target. In the overfilled mode, the measurement beam generates a spot that is larger than the overall target. In such overfilled mode, it may also be possible to measure different targets simultaneously, thus determining different processing parameters at the same time.

Overall measurement quality of a lithographic parameter using a specific target is at least partially determined by the measurement recipe used to measure this lithographic parameter. The term "substrate measurement recipe" may include one or more parameters of the measurement itself, one or more parameters of the one or more patterns measured, or both. For example, if the measurement used in a substrate measurement recipe is a diffraction-based optical measurement, one or more of the parameters of the measurement may include the wavelength of the radiation, the polarization of the radiation, the incident angle of radiation relative to the substrate, the orientation of radiation relative to a pattern on the substrate, etc. One of the criteria to select a measurement recipe may, for example, be a sensitivity of one of the measurement parameters to processing variations. More examples are described in U.S. patent application publication nos. US2016-0161863 and US 2016/0370717, each incorporated herein in its entirety by reference.

Figure 4:
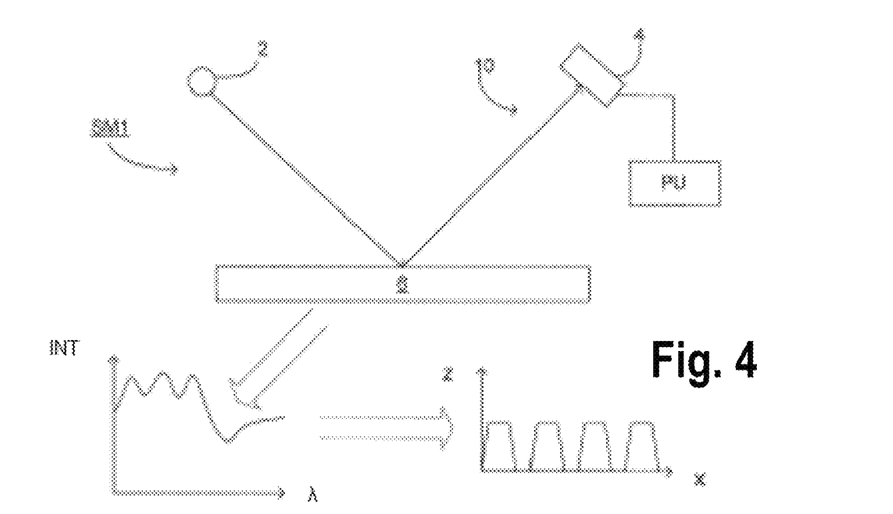
FIG. 4 depicts a schematic representation of a scatterometer.

A metrology apparatus, such as a scatterometer SM1, is depicted in FIG. 4. It comprises a broadband (e.g., white light) radiation projector 2 which projects radiation onto a substrate 6. The reflected or scattered radiation is passed to a spectrometer detector 4, which measures a spectrum 10 (i.e. a measurement of intensity INT as a function of wavelength λ) of the specular reflected radiation. From this data, the structure or profile giving rise to the detected spectrum may be reconstructed by processing unit PU, e.g. by Rigorous Coupled Wave Analysis and non-linear regression or by comparison with a library of simulated spectra as shown at the bottom of FIG. 4. In general, for the reconstruction, the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

It has also been considered to use soft X-rays or EUV radiation, for example radiation in a wavelength range between 0.1 nm and 100 nm, or optionally between 1 nm and 50 nm or optionally between 10 nm and 20 nm. One example of metrology tool functioning in one of the above presented wavelength ranges is transmissive small angle X-ray scattering (T-SAXS as in U.S. patent application publication no. US 2007-224518, which is incorporated herein in its entirety by reference). Profile (CD) measurements using T-SAXS are discussed by Lemaillet et al in "Intercomparison between optical and X-ray scatterometry measurements of FinFET structures", Proc. of SPIE, 8681 (2013). Reflectometry techniques using X-rays (GI-XRS) and extreme ultraviolet (EUV) radiation at grazing incidence are known for measuring one or more properties of films and stacks of layers on a substrate. Within the general field of reflectometry, goniometric and/or spectroscopic techniques can be applied. In goniometry, the variation of a reflected beam with different incidence angles is measured. Spectroscopic reflectometry, on the other hand, measures the spectrum of wavelengths reflected at a given angle (using broadband radiation). For example, EUV reflectometry has been used for inspection of mask blanks, prior to manufacture of reticles (patterning devices) for use in EUV lithography.

It is possible that the range of application makes the use of wavelengths in the soft X-rays or EUV domain not sufficient. Therefore, U.S. patent application publication nos. US 2013/0304424 and US 2014/019097 describe hybrid metrology techniques in which measurements made using x-rays and optical measurements with wavelengths in the range 120 nm and 2000 nm are combined together to obtain a measurement of a parameter such as CD. A CD measurement is obtained by coupling an x-ray mathematical model and an optical mathematical model. The entire content of the cited U.S. patent application publications are incorporated herein in their entireties by reference.

Figure 5:
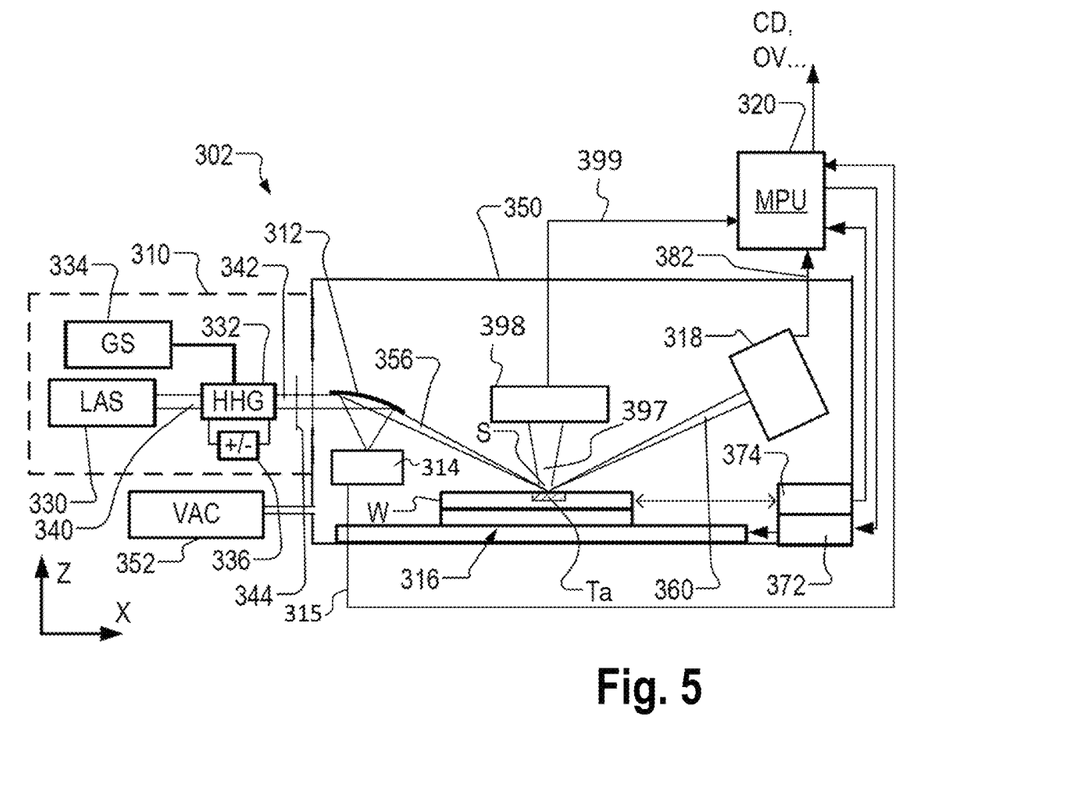
FIG. 5 depicts a schematic representation of a metrology apparatus.

FIG. 5 depicts a schematic representation of a metrology apparatus 302 in which radiation in the wavelength range from 0.1 nm to 100 nm may be used to measure one or more parameters of structures on a substrate. The metrology apparatus 302 presented in FIG. 5 is suitable for the soft X-rays (SXR) or EUV domain.

FIG. 5 illustrates a schematic physical arrangement of a metrology apparatus 302 comprising a spectroscopic scatterometer using EUV and/or SXR radiation in grazing incidence, purely by way of example. An alternative form of inspection apparatus might be provided in the form of an angle-resolved scatterometer, which uses radiation in normal or near-normal incidence similar to the conventional scatterometers operating at longer wavelengths.

Inspection apparatus 302 comprises a radiation source 310, illumination system 312, substrate support 316, detection systems 318, 398 and metrology processing unit (MPU) 320.

Source 310 in this example comprises a generator of EUV or soft x-ray radiation based on high harmonic generation (HHG) techniques. Such sources are available for example from KMLabs, Boulder Colo., USA (http://www.kmlabs.com/). Main components of the radiation source are a drive laser 330 and an HHG gas cell 332. A gas supply 334 supplies suitable gas to the gas cell, where it is optionally ionized by an electric source 336. The drive laser 330 may be, for example, a fiber-based laser with an optical amplifier, producing pulses of infrared radiation that may last for example less than 1 ns (1 nanosecond) per pulse, with a pulse repetition rate up to several megahertz, as required. The wavelength of the infrared radiation may be for example in the region of 1 μm (1 micron). The laser pulses are delivered as a first radiation beam 340 to the HHG gas cell 332, where in the gas a portion of the radiation is converted to higher frequencies than the first radiation into a beam 342 including coherent second radiation of the desired wavelength or wavelengths.

The second radiation may contain multiple wavelengths. If the radiation were monochromatic, then measurement calculations (for example reconstruction) may be simplified, but it is easier with HHG to produce radiation with several wavelengths. The volume of gas within the gas cell 332 defines an HHG space, although the space need not be completely enclosed and a flow of gas may be used instead of a static volume. The gas may be for example a noble gas such as neon (Ne) or argon (Ar). $N_2$, $O_2$, He, Ar, Kr, Xe gases can all be considered. These are matters of design choice, and may even be selectable options within the same apparatus. Different wavelengths will, for example, provide different levels of contrast when imaging structure of different materials. For inspection of metal structures or silicon structures, for example, different wavelengths may be selected to those used for imaging features of (carbon-based) resist, or for detecting contamination of such different materials. One or more filtering devices 344 may be provided. For example, a filter such as a thin membrane of aluminum (Al) may serve to cut the fundamental infrared (IR) radiation from passing further into the inspection apparatus. A grating (not shown) may be provided to select one or more specific harmonic wavelengths from among those generated in the gas cell. Some or all of the beam path may be contained within a vacuum environment, bearing in mind that SXR radiation is absorbed when traveling in air. The various components of radiation source 310 and illumination optics 312 can be adjustable to implement different metrology 'recipes' within the same apparatus. For example different wavelengths and/or polarization can be made selectable.

Depending on the materials of the structure under inspection, different wavelengths may offer a desired level of penetration into lower layers. For resolving the smallest device features and defects among the smallest device features, a short wavelength is likely to be preferred. For example, one or more wavelengths in the range 1-20 nm or optionally in the range 1-10 nm or optionally in the range 10-20 nm may be chosen. Wavelengths shorter than 5 nm suffer from very low critical angle when reflecting off materials typically of interest in semiconductor manufacture. Therefore to choose a wavelength greater than 5 nm will provide stronger signals at higher angles of incidence. On the other hand, if the inspection task is for detecting the presence of a certain material, for example to detect contamination, then wavelengths up to 50 nm could be useful.

From the radiation source 310, the filtered beam 342 enters an inspection chamber 350 where the substrate W including a structure of interest is held for inspection at a measurement position by substrate support 316. The structure of interest is labeled Ta. The atmosphere within inspection chamber 350 is maintained near vacuum by vacuum pump 352, so that EUV radiation can pass without undue attenuation through the atmosphere. The illumination system 312 has the function of focusing the radiation into a focused beam 356, and may comprise for example a two-dimensionally curved mirror, or a series of one-dimensionally curved mirrors, as described in U.S. patent application publication no. US 2017/0184981 (which is incorporated herein in its entirety by reference). The focusing is performed to achieve a round or elliptical spot S under 10 μm in width (e.g., diameter), when projected onto the structure of interest. Substrate support 316 comprises for example an X-Y translation stage and a rotation stage, by which any part of the substrate W can be brought to the focal point of beam to in a desired orientation. Thus the radiation spot S is formed on the structure of interest. Alternatively, or additionally, substrate support 316 comprises for example a tilting stage that may tilt the substrate W at a certain angle to control the angle of incidence of the focused beam on the structure of interest Ta.

Optionally, the illumination system 312 provides a reference beam of radiation to a reference detector 314 which may be configured to measure a spectrum and/or intensities of different wavelengths in the filtered beam 342. The reference detector 314 may be configured to generate a signal 315 that is provided to processor 320 and the filter may comprise information about the spectrum of the filtered beam 342 and/or the intensities of the different wavelengths in the filtered beam.

Redirected radiation 360 is captured by detector 318 and a spectrum is provided to processor 320 for use in calculating a property of the target structure Ta, such as overlay (OV), critical dimension (CD), etc. The illumination system 312 and detection system 318 thus form an inspection apparatus. This inspection apparatus may comprise a soft X-ray and/or EUV spectroscopic reflectometer of the kind described in U.S. patent application publication no. US 2016/282282, which is incorporated herein in its entirety by reference.

If the target Ta has a certain periodicity, the radiation of the focused beam 356 may be partially diffracted as well. The diffracted radiation 397 follows another path at well-defined angles with respect to the angle of incidence than the radiation 360. In FIG. 5, the drawn diffracted radiation 397 is drawn in a schematic manner and diffracted radiation 397 may follow many other paths than the drawn paths. The inspection apparatus 302 may also comprise further detection systems 398 that detect and/or image at least a portion of the diffracted radiation 397. In FIG. 5 a single further detection system 398 is drawn, but embodiments of the inspection apparatus 302 may also comprise more than one further detection system 398 that are arranged at a different position to detect and/or image diffracted radiation 397 at a plurality of diffraction directions. In other words, the (higher) diffraction orders of the focused radiation beam that impinges on the target Ta are detected and/or imaged by one or more further detection systems 398. The one or more detection systems 398 generates a signal 399 that is provided to the metrology processor 320. The signal 399 may include information of the diffracted radiation 397 and/or may include images obtained from the diffracted radiation 397.

To aid the alignment and focusing of the spot S with desired product structures, inspection apparatus 302 may also provide auxiliary optics using auxiliary radiation under control of metrology processor 320. Metrology processor 320 can also communicate with a position controller 372 which operates the translation stage, rotation and/or tilting stages. Processor 320 receives highly accurate feedback on the position and orientation of the substrate, via one or more sensors. One or more sensors 374 may include one or more interferometers, for example, which can give accuracy in the region of picometers. In the operation of the inspection apparatus 302, spectrum data 382 captured by detection system 318 is delivered to metrology processing unit 320.

As mentioned, an alternative form of inspection apparatus uses soft X-ray and/or EUV radiation at normal incidence or near-normal incidence, for example to perform diffraction-based measurements of asymmetry. Both types of inspection apparatus could be provided in a hybrid metrology system. Performance parameters to be measured can include overlay (OVL), critical dimension (CD), coherent diffraction imaging (CDI) and/or at-resolution overlay (ARO) metrology. The soft X-ray and/or EUV radiation may for example have wavelengths less than 100 nm, for example using radiation in the range 5-30 nm, of optionally in the range from 10 nm to 20 nm. The radiation may be narrowband or broadband in character. The radiation may have discrete peaks in a specific wavelength band or may have a more continuous character.

Like an optical scatterometer used in today's production facilities, the inspection apparatus 302 can be used to measure structures within the resist material treated within the litho cell (After Develop Inspection or ADI), and/or to measure structures after they have been formed in harder material (After Etch Inspection or AEI). For example, substrates may be inspected using the inspection apparatus 302 after they have been processed by a developing apparatus, etching apparatus, annealing apparatus and/or other apparatus.

A metrology tool MT, including but not limited to one or more scatterometers mentioned above, may use radiation from a radiation source to perform a measurement. The radiation used by a metrology tool MT may be electromagnetic radiation. The radiation may be optical radiation, for example radiation in the infrared, visible, and/or ultraviolet parts of the electromagnetic spectrum. A metrology tool MT may use radiation to measure or inspect one or more properties and/or one or more aspects of a substrate. For example, a metrology tool MT may measure a lithographically exposed pattern on a substrate. The type and quality of the measurement may depend on several factors, including the radiation used to measure the substrate. The wavelength of the radiation used to interrogate a substrate may affect the quality and information that may be obtained from a measurement. For example, the wavelength of radiation may affect the smallest distinguishable feature because of the diffraction limit. The optical response of a substrate and/or a pattern of a substrate may be wavelength-dependent. For example diffraction effects, and transmission and/or absorption properties of substrates and patterns may be wavelength-dependent. Therefore, it may be beneficial to be able to interrogate a substrate using a plurality of wavelengths. It may also be beneficial to be able to control and select which one or more wavelengths to use for a measurement. Metrology tools may obtain this functionality by having access to broadband radiation. Further functionality may be provided to the metrology tool MT by allowing control of the radiation wavelength used for measurements. For example, one or more filters may be used to select radiation of desired wavelength(s) and/or in a desired wavelength range.

Generating and providing high quality radiation may present challenges. Broadband radiation may be obtained using supercontinuum generation. This may provide a radiation over a continuous and wide range of wavelengths. Supercontinuum radiation may, for example, comprise radiation over a range from 400 nm to 2400 nm. Supercontinuum radiation may, for example, comprise substantially every wavelength in the range of 400 nm to 2400 nm. Due to dispersion, it may be challenging to provide optics that are able to consistently control radiation over this entire wavelength range. It may therefore be challenging to provide an optical assembly for controlling radiation spanning a broadband wavelength range. The broadband performance of an optical assembly may be improved by adding additional optical elements, which may add complexity and cost, and may be undesirable.

Next to performance over a broadband wavelength range, an optical assembly may also experience challenges in the control of high power radiation. For example, high intensity radiation may be incident an optical assembly in on/off cycles. This may cause heating and cooling of optical elements in the assembly, which may affect one or more properties and/or the performance of the optical elements. High power radiation may, for example, cause heat damage to one or more optical elements in an assembly. For example, heating and cooling may lead to expansion and reduction of the size of the elements, which may cause the elements to move. This movement may result in an offset of one or more optical elements from their intended position, which may negatively affect the performance of the optical assembly. For example, a 1 µm offset of an optical element may result in a loss of up to 10% of the radiation successfully propagating through the system.

Broadband radiation, such as supercontinuum radiation, may be generated under high power conditions. For example, non-linear processes may be used for broadband radiation generation, which may require high power radiation. The resulting broadband radiation may also be high power radiation. High power radiation may for example have an average power of 1 W or more, or of 5 W or more. Broadband radiation may be generated in an uncollimated form. In order to process the generated broadband radiation it may be optically controlled. The optical control may comprise collimating the broadband radiation. An air-spaced doublet is a commonly used optical element for collimating a radiation beam. However, such an air-spaced doublet may experience instability in position and/or one or more properties in high intensity radiation operating conditions. The present disclosure describes one or more assemblies for controlling broadband radiation, which may be suitable for operating at high intensities.

Figure 6:
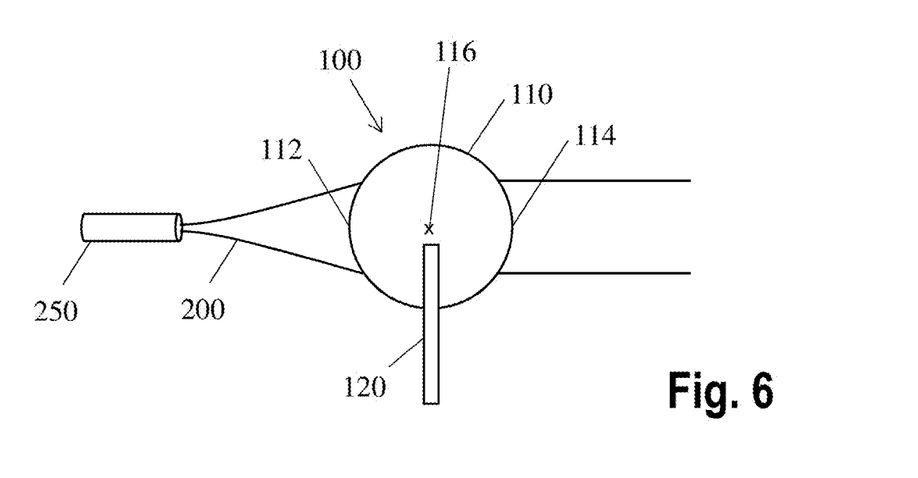
FIG. 6 depicts a schematic representation of an assembly comprising a singlet lens for collimating broadband radiation.

FIG. 6 illustrates broadband radiation 200 provided to an optical assembly 100. The broadband radiation 200 may be output by a fiber 250, and may be received by the assembly 100. The fiber 250 may form part of a source. The assembly 100 may be configured to collimate the received broadband radiation into collimated broadband radiation. In order to collimate the radiation, the assembly 100 may provide a first lens 110. The first lens 110 may be a convex refractive singlet lens. The first lens 110 may have a first spherical surface 112, facing towards incident broadband radiation, for coupling the broadband radiation into the lens. The first lens may further comprise a second spherical surface 114 for coupling collimated broadband radiation out of the first lens 110. The first spherical surface and the second spherical surface of the singlet lens 110 have a common center 116. The assembly 100 may further comprise a mount 120 for holding the first lens 110.

The first lens may perform a function as a collimator. An advantage of providing a collimator in the form of a convex refractive singlet lens having first and second spherical surfaces is that it provides a single optical element for collimating a beam. Due to the spherical surfaces having a common center, the setup may be unaffected by tilt of the lens. This may improve the mechanical stability of the lens, for example compared to an air-spaced doublet, in which tilting the lens would result in alteration of the radiation path. As well as a tilt independence, the convex refractive singlet can be easy to keep stable mechanically due to the simplicity of holding a lens comprising a single element in place. Despite being a singlet, the spherical design of the convex refractive singlet may perform well over a broadband wavelength range. An additional advantage of providing a convex refractive singlet as a first lens may include ease of fabrication of the lens due to the spherical surfaces, and the lens comprising a single element.

The spherical surfaces may be substantially spherical. That is to say, the shape of the surfaces may in some instances comprise a small deviation from an exact spherical shape. For example, a surface may be spherical within fabrication tolerances. A surface may approximate a spherical shape, wherein small deviations may be a design choice. For example, the refractive singlet may be considered to have spherical surfaces with a 1%, 2%, or 5% tolerance on variations on the radius of curvature. An acceptable amount of deviation from a spherical shape may be determined by the requirements of the assembly 100 and the application for which it is used, as the deviation may affect the tilt independence and/or mechanical stability of the lens 110.

An anti-reflection coating may be applied to one or both surfaces of singlet lens 110. The anti-reflection coating may be a thin layer comprising one or more materials, applied to a surface of the lens. The relationship between the refractive index of the lens material and the refractive index and thickness of the one or more layers of the anti-reflection coating may be designed to reduce reflection of at least some of the radiation incident on the coated surface.

Figure 7A:
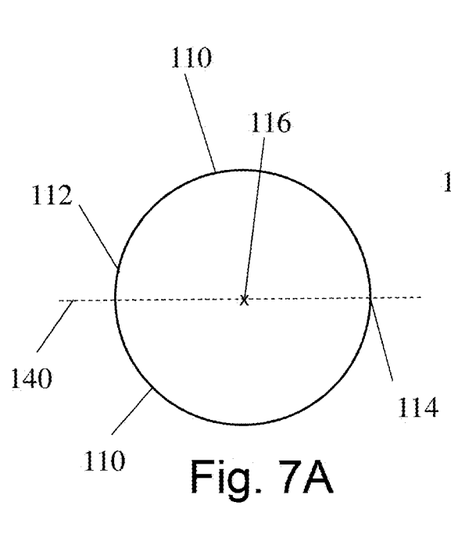
FIGS. 7A and 7B depicts schematic representations of convex refractive singlet lenses for collimating broadband radiation.
Figure 7B:
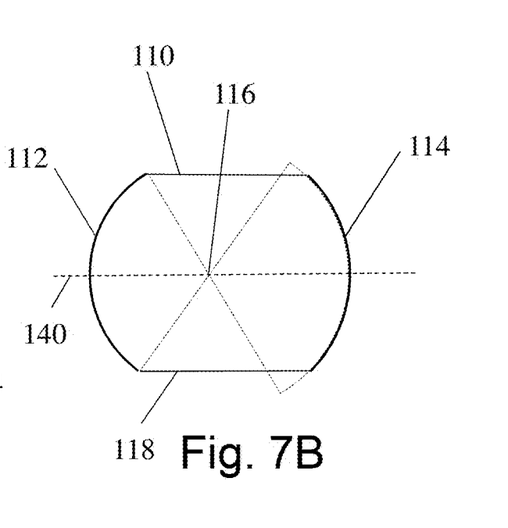

FIGS. 7A and 7B depict schematic representations of convex refractive singlet lenses 110. A common center 116 may be understood to be a common center of curvature for the first 112 and second 114 spherical surfaces. The first 112 and second 114 spherical surfaces may have the same radius of curvature, as illustrated in FIG. 7A. The first 112 and second 114 surfaces may alternatively have different radii of curvature, as illustrated in FIG. 7B, while still having a common center 116. In some implementations, the first lens 110 may have a whole spherical shape, as illustrated in FIG. 7A. Such a shape may have an advantage of being easy to fabricate. The spherical symmetry may provide mechanical stability to the assembly 100. An example singlet lens 110 may have a spherical shape with a radius in the order of a few mm, for example 2.809 mm. The effective focal length of the singlet lens 110 may be in the order of a few mm, for example 4.4±0.1 mm. In other implementations, the first lens 110 may comprise one or more additional surfaces 118, which may be non-spherical, as illustrated in FIG. 7B. For example, the assembly 100 may have an optical path 140 through the assembly 100. The optical path 140 may pass through the common center 116. The first 112 and second 114 spherical surfaces may be located near the optical path 140, so that radiation incident on the first lens 110 interacts with the first 112 and second 114 spherical surfaces. The first 112 and second 114 surfaces may for example comprise sectors of a sphere. One or more other surfaces 118 may be located away from the optical path 140, so that radiation incident on the first lens 110 does not interact with these one or more surfaces under normal operation of the assembly 100. For example, one or more of the top, bottom and/or side of the lens, which are not near the optical path may have a non-spherical shape. A non-spherical surface 118 may be a cylindrical surface or a planar surface, and may be parallel to optical path 140.

In order to be able to perform a collimating function for broadband radiation, the first lens 110 may be made from a low-dispersion material. A low dispersion material may have an Abbe number with a value above a predetermined threshold. The threshold may be set based on the requirements and tolerances of the application in which the assembly 100 is to be used. The low dispersion material may have an Abbe number with a value over 80. The low dispersion material may have a value over 90. If a low dispersion material with an Abbe value below 80 is used, this may lead to performance degradation of the lens 110 in the assembly 100. The performance loss may for example be due to increased reflection losses and/or increased absorption losses. The low dispersion of the material may be tailored for the wavelength range of interest, for example 500 nm to 900 nm. The low dispersion material may be a glass material. The low dispersion material may for example comprise fluorine crown glass, such as N-FK51A (Abbe number $V_d$=84.47) glass, or N-FK58 glass (Abbe number $V_d$=90.9), both as marketed by Schott AG of Germany, or calcium fluoride (CaF2) glass (Abbe number $V_d$=94.99). It will be appreciated that other low dispersion materials may be used to form the convex singlet lens 110. By choosing a glass material with a low refractive index, such as a crown glass, reflection losses may be lowered compared to glass materials with a higher refractive index.

Figure 8:
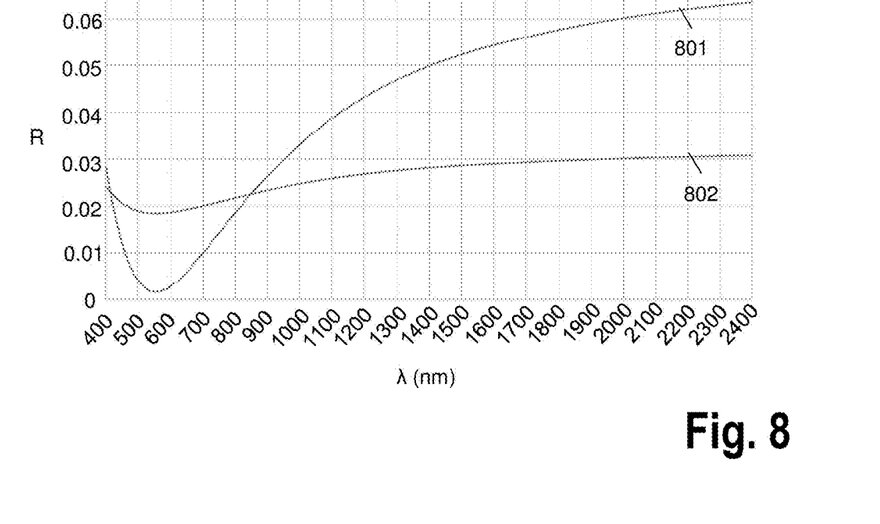
FIG. 8 depicts a graph showing material reflectance as a function of wavelength.

FIG. 8 depicts a graph showing simulated reflectance curves for two different materials. The reflectance curve 801 is related to a first material with a higher refractive index (e.g. n=1.7561 for a wavelength of 632.8 nm). The reflectance curve 802 is related to a second material with a lower refractive index (e.g. N-FK58 glass with refractive index n=1.45494 for a wavelength of 632.8 nm), and lower dispersion compared to the material of curve 801. The curves show reflectance over a wavelength range from 400 nm to 2400 nm. The reflectance for 801 is lower in the range around 400 nm to 800 nm, compared to curve 802. However, the reflectance for infrared radiation is lower for the curve 802. A lower reflectance may mean lower losses associated with reflection. Lower reflectance in the infrared radiation range may also reduce the thermal load on one or more materials preceding the lens 110. One or more materials preceding the lens 110 may for example comprise one or more selected from: a fiber, a ferrule, adhesive, etc. Lower refractive index material 802 may further have a lower absorption compared to a material with higher refractive index 801. This may reduce the thermal load on the lens material. This may lead to better control of heating within an optical assembly. Using a material with low dispersion and low reflectance may improve the efficiency of the setup through improved performance over a broadband range, and/or may improve the lifetime of the system by reducing the likelihood of heat damage. Using a singlet lens 110 in assembly 100 with low dispersive properties and low refractive index may result in a reduction of the temperature by several degrees Celsius of the singlet lens 110 compared to a doublet lens.

An advantage of using a singlet lens may be the ease with which the singlet may be mounted. When mounting optical systems comprising multiple optical elements, adhesive may be used to attach optical elements to each other, which may set the position of the elements relative to each other. However, the adhesive may not be suitable in applications using high power radiation, which may burn the adhesive and/or cause other heat damage. Using mechanical elements to hold optical elements in position relative to each other (e.g. placing and securing the elements in a tube) may also result in a build-up of heat. The mechanical setup may also be sensitive to offset caused by heating and/or cooling of the elements and/or mechanical elements.

Figure 9:
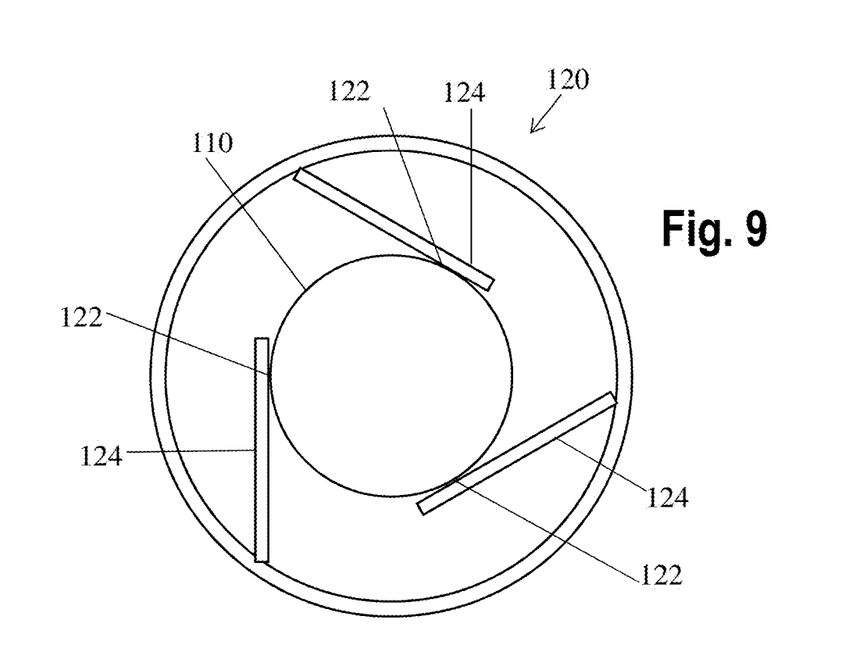
FIG. 9 depicts a schematic representation of a kinematic mount for a singlet lens.

The convex refractive singlet lens 110 may be mounted on a kinematic mount 120. A kinematic mount 120 may be a mount that provides no degrees of freedom in positioning of the singlet lens 110. The singlet lens 110 may therefore be reliably positioned inside an optical assembly 100. The kinematic mount 120 may provide thermally centered positioning, so that the singlet lens 110 may be reliably positioned in an assembly 100. In this context, thermally centered positioning means that the center of the mount remains substantially stable when the mount expands/contracts due to thermal load. FIG. 9 depicts a schematic representation of a kinematic mount 120 holding a convex refractive singlet lens 110. The kinematic mount may contact the singlet lens 110 at a plurality of contact points 122. The kinematic mount 120 may for example comprise three contact points to the singlet lens 110, as depicted in FIG. 9. The kinematic mount 120 may comprise a plurality of contacts 124 for forming the contact points 122. The contacts may be leaf spring contacts 124. The leaf spring contacts 124 may be urged into contact with a singlet lens 110 by a spring force applied of the plurality of leaf springs. The centroid of the kinematic mount 120 may coincide with the common center 116 of the first 112 and second 114 spherical surfaces of the singlet lens 110. The centroid of the contact points may be a center of gravity for the contacts 124 of the kinematic mount 120. The contact points 122 may contact the singlet lens in an equatorial plane of the singlet lens. That is to say, the contact points 122 may all lie in the essentially same plane (e.g., no more than 5% deviation from coplanar). When the singlet lens 110 is mounted inside the kinematic mount 120, the common center 116 of the first 112 and second 114 spherical surfaces of lens 110 may be essentially co-planar with the plane of the contact points 122. The singlet lens may comprise a cylindrical surface in between the first 112 and second 114 spherical surfaces. The contact points 122 may contact the singlet lens on the cylindrical surface, which may provide additional stability to the mounting of the lens.

Figure 10:
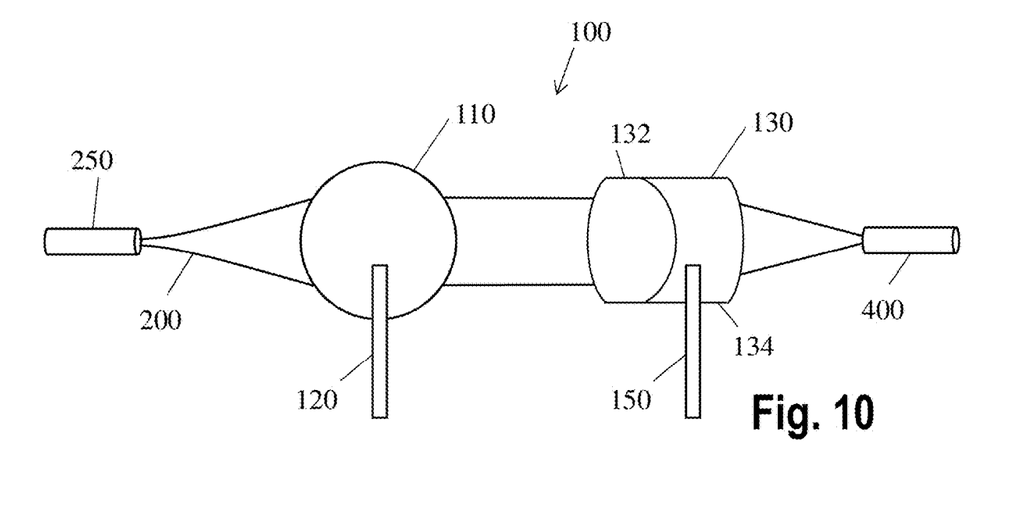
FIG. 10 depicts a schematic representation of an assembly for collimating and focusing broadband radiation.

As well as collimating radiation, assembly 100 may perform other manipulation and control of the radiation 200. FIG. 10 depicts a schematic representation of an assembly 100 comprising a second lens 130 for focusing the collimated radiation. Broadband radiation 200 is provided to an assembly 100 for collimating and focusing the radiation. The first lens 110 may be held in a mount 120, as described in more detail above. The broadband radiation 200 collimated by the first lens 110 may be incident upon a second lens 130. The second lens may be a coupling refractive lens 130 for focusing the collimated broadband radiation. For example, coupling lens 130 may focus the collimated radiation 200 for coupling the radiation into a fiber 400. The fiber 400 may guide the radiation for providing it at a location of interest. Alternatively, to focusing the radiation for coupling into a fiber 400, the coupling lens 130 may focus or control the radiation for another purpose. For example, coupling lens 130 may focus collimated radiation 200 onto a target. The coupling lens may be a chromatic doublet lens. The chromatic doublet lens 130 may comprise two lens elements, forming a doublet. The first lens element of the doublet may be referred to as the front lens element 132. The front lens element may receive collimated radiation. The second lens element of the doublet may be referred to as the back lens element 134. One or both of the front lens element 132 and back lens element 134 may comprise a spherical surface. In some implementations, one or both of the front 132 and back 134 lens elements may have an aspherical surface. Broadband radiation 200 may couple out of the back lens element. The front 132 and back 134 lens elements may be secured to each other using adhesive. Alternatively or additionally, the front 132 and back 134 lens elements may be secured together by a retaining ring. The front 132 and back 134 lens elements may be made from different materials. The front lens element 132 may comprise low refractive index and/or low dispersion glass. For example, the front lens element 132 may be made from crown glass, for example N-LAK7 glass as marketed by Schott AG of Germany. The back lens element 134 may comprise high refractive index and/or high dispersion glass. For example, the back lens element 134 may be made from flint glass, for example SF6 glass as marketed by Schott AG of Germany. The front lens element 132 may have a biconvex shape. The back lens element 134 may have a positive meniscus shape. The coupling lens 130 may be mounted into a mount 150. The mount 150 may be a kinematic mount. The coupling lens 130 may comprise an anti-reflection coating applied to one or both of the external surfaces of the coupling lens 130, wherein the first external surface may be the front surface of the front lens element 132 for receiving radiation, and the second external surface may be the back surface of the back lens element 134 out of which radiation may be coupled.

The assembly 100 of FIG. 10 may be for coupling broadband radiation into a fiber 400. A first lens 110 may collimate incident broadband radiation 200, and a second lens may couple the collimated radiation into fiber 400. The first lens 110 may be a convex refractive singlet lens as described above. The second lens 130 may be a chromatic doublet lens as described above. The first lens may have first dispersive properties that may cause chromatic dispersion in the broadband radiation coupled out of the first lens 110. The amount and type of dispersion may depend on the type of material from which the first lens 110 is made. The amount of chromatic dispersion may be limited by having a first lens 110 made from a low dispersion material. The second lens 130 may have second dispersive properties that may cause further chromatic dispersion in the broadband radiation 200. The second lens may be designed in relation to the first lens 110. Specifically, the design of the two lenses may be chosen so that the second dispersive properties are coupled to the first dispersive properties. The second dispersive properties may be configured so that the second lens 130 corrects at least a portion of the chromatic dispersion introduced by the first lens 110. For example, the front lens element 132 may have a convex shape and be made from a low refractive index/low dispersion glass. Some of the dispersion introduced by this front lens element 132 may be counteracted by chromatic dispersion introduced by the back lens element 134. The back lens element may, for example, have a concave shape and be made from a high refractive index/high dispersion glass. Using a convex singlet as a first lens and a chromatic doublet as a second lens, the coupling efficiency of radiation into fiber 400 may be more than 70%, more than 75%, or more than 80%. The coupling efficiency may be determined over a wavelength range of interest, for example from 500 nm to 900 nm.

The second dispersive properties may be chosen to at least partially correct for dispersion introduced by the first lens 110, in a set wavelength range. The set wavelength range may comprise a portion of the broadband radiation wavelength range. In an example implementation, the broadband radiation comprises supercontinuum radiation, and may span a wavelength range from 400 nm to 2400 nm. The materials and/or shape of the second lens 130 may be designed to optimize the dispersive properties for radiation in the range of 500 nm to 900 nm.

The broadband radiation 200 described herein as being received by the assembly 100 may be provided by a broadband radiation source. The broadband radiation may be received from a fiber 250 output. The broadband radiation 200 may comprise radiation in the range of 400 nm to 2400 nm. The broadband radiation may comprise a wavelength range of interest spanning 500 nm-900 nm. The broadband radiation 200 may comprise supercontinuum radiation. The supercontinuum radiation may span at least a portion of the broadband radiation range 400 nm to 2400 nm. In one example, the supercontinuum radiation comprises nominally all wavelengths in the range of 500 nm to 900 nm. Alternatively or additionally, the broadband radiation 200 may comprise one or more individual wavelengths or narrow wavelength bands within the broadband radiation range.

The broadband radiation 200 coupled into assembly 100 may comprise peak powers between 50 W and 500 W. The average power of radiation coupled into the assembly 100 may be around the order of 10 W. The distribution of power across the wavelengths may be irregular. In one example, broadband radiation may comprise around 0.2 W average power in wavelengths below 500 nm, around 2.3 W average power in wavelengths between 500 nm and 900 nm, and around 700 W average power in wavelengths above 900 nm. The broadband radiation may be pulsed radiation. The pulse frequency may be in the order of tens of MHz, for example 40 MHz. The duration of a pulse may be in the order of hundreds of picoseconds, for example 500 ps. At the second lens 130, the power of the broadband radiation may have been reduced. The reduction in power may for example be caused by losses and/or radiation filtering. At the coupling lens 130, the average radiation power may for example be reduced to the order of 1 W or less. The peak powers at the coupling lens 130 may remain below approximately 50 W.

One or more filters and/or one or more other optical elements for manipulating and controlling radiation may be included in assembly 100. The assembly 100 may comprise one or more filters for reducing and/or removing radiation with specific wavelengths from the broadband radiation passing through the assembly 100. One or more filters may for example block one or more individual wavelength(s), and/or one or more bands/ranges of wavelengths. One or more filters may be used to set which wavelengths are output by assembly 100. One or more optical elements may be provided for example for cleaning up the shape of the radiation beam.

The assemblies described herein may be used for manipulating and controlling high power broadband radiation. The assembly 100 may collimate the broadband radiation with a first singlet lens 110, and use a second lens to focus the collimated radiation into a fiber 400. This setup may form a radiation source, wherein the output of the fiber 400 may be the radiation output by the source. The assembly 100 may be provided, either by itself, or as a radiation source, in a metrology apparatus, in an inspection apparatus, in a lithographic apparatus LA, and/or in a lithographic cell LC.

Further embodiments of the invention are disclosed in the list of numbered clauses below:

1. An assembly for collimating broadband radiation, the assembly comprising:
a convex refractive singlet lens having a first spherical surface for coupling the broadband radiation into the lens and a second spherical surface for coupling collimated broadband radiation out of the lens, wherein the first and second spherical surfaces have a common center; and
a mount for holding the convex refractive singlet lens.
2. An assembly according to clause 1, wherein the convex refractive singlet lens has a substantially spherical shape.
3. An assembly according to clause 1 or clause 2, wherein the convex refractive singlet lens comprises a low dispersion material.
4. An assembly according to clause 3, wherein the low dispersion material has an Abbe number above 80.
5. An assembly according to clause 3 or clause 4, wherein the low dispersion material is N-FK58 glass.
6. An assembly according to any of clauses 1 to 5, wherein the convex refractive singlet comprises an anti-reflection coating.
7. An assembly according to any of clauses 1 to 6, wherein the mount is a kinematic mount.
8. An assembly according to clause 7, wherein the kinematic mount contacts the singlet lens at a plurality of contact points.
9. An assembly according to clause 8, wherein the singlet lens is positioned inside the mount such that a centroid of the contact points of the kinematic mount coincides with the center of the first and second spherical lens surfaces.
10. An assembly according to any of clauses 7 to 9, wherein the mount contacts the singlet lens in an equatorial plane of the singlet lens.
11. An assembly according to clause 8, wherein the mount comprises a plurality of leaf spring contacts urged into contact with the singlet lens.
12. An assembly according to any of clauses 8 to 11, wherein the kinematic mount contacts the singlet lens at three locations.
13. An assembly according to any of clauses 1 to 12, further comprising a coupling refractive lens for coupling the collimated broadband radiation into a fiber.
14. An assembly according to clause 13, wherein the coupling refractive lens comprises an anti-reflection coating.
15. An assembly according to clause 13 or clause 14, wherein the coupling refractive lens is a chromatic doublet lens.
16. An assembly according to clause 15, wherein the chromatic doublet lens has a front lens element for coupling the broadband radiation into the lens, and a back lens element for coupling the broadband radiation out of the lens.
17. An assembly according to clause 16, wherein the front lens element comprises N-LAK7 glass, and wherein the back lens element comprises SF6 glass.
18. An assembly according to clause 16 or clause 17, wherein the front lens element has a biconvex shape, and wherein the back lens element has a positive meniscus shape.
19. An assembly according to any of clauses 15 to 18, wherein the front lens element and the back lens element of the chromatic doublet lens are attached to each other with an adhesive.
20. An assembly according to any of clauses 13 to 19, wherein the coupling efficiency into the fiber is >80%.
21. An assembly according to any of clauses 1 to 20, wherein the broadband radiation is received from a fiber output.
22. An assembly according to any of clauses 1 to 21, wherein the broadband radiation comprises supercontinuum radiation.
23. An assembly according to any of clauses 1 to 22, wherein the broadband radiation comprises radiation with wavelengths in the range of 400 nm to 2400 nm.
24. An assembly according to clause 23, wherein the broadband radiation comprises radiation with wavelengths in the range of 500 nm to 900 nm.

25. An assembly according to any of clauses 1 to 24, wherein the broadband radiation coupled into the lens comprises peak powers between 50 W and 500 W.

26. An assembly according to any of clauses 1 to 25, wherein the broadband radiation comprises pulsed radiation.

27. An assembly for coupling broadband radiation into a fiber, the assembly comprising:
 a first lens for collimating the broadband radiation; and
 a second chromatic doublet lens for coupling the collimated broadband radiation into a fiber,
 wherein the first lens has first dispersive properties that cause chromatic dispersion in the broadband radiation, and
 wherein the second lens has second dispersive properties coupled to the dispersive properties of the first lens, the second dispersive properties configured to correct at least a portion of the chromatic dispersion caused by the first lens.

28. An assembly according to clause 27, wherein the first lens is a singlet lens.

29. An assembly according to clause 28, wherein the singlet lens has a spherical shape.

30. An assembly according to any of clauses 27 to 29, wherein the first lens is designed to optimize the dispersive properties for radiation in the range of 500 nm to 900 nm.

31. A radiation source comprising an assembly according to any of clauses 1 to 30, a broadband radiation source for providing radiation to the assembly, and a fiber for collecting and outputting radiation.

32. A method of collimating broadband radiation comprising:
 providing a convex refractive singlet lens having a first spherical surface for coupling broadband radiation into the lens and a second spherical surface for coupling collimated broadband radiation out of the lens, wherein the first and second spherical surfaces have a common center;
 mounting the convex refractive singlet lens in a kinematic mount; and
 directing broadband radiation from a source into the first spherical surface of the convex refractive singlet lens.

33. A metrology apparatus comprising an assembly according to any of clauses 1 to 30.

34. An inspection apparatus comprising an assembly according to any of clauses 1 to 30.

35. A lithographic apparatus comprising an assembly according to any of clauses 1 to 30.

36. A convex refractive singlet lens configured for the assembly of any of clauses 1 to 35 having a first spherical surface for coupling broadband radiation into the lens and a second spherical surface for coupling collimated broadband radiation out of the lens, wherein the first and second spherical surfaces have a common center, and wherein the refractive singlet lens comprises a low dispersion material having an Abbe number above 80.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

Although specific reference is made to "metrology apparatus/tool/system" or "inspection apparatus/tool/system", these terms may refer to the same or similar types of tools, apparatuses or systems. E.g. the inspection or metrology apparatus that comprises an embodiment of the invention may be used to determine characteristics of structures on a substrate or on a wafer. E.g. the inspection apparatus or metrology apparatus that comprises an embodiment of the invention may be used to detect defects of a substrate or defects of structures on a substrate or on a wafer. In such an embodiment, a characteristic of interest of the structure on the substrate may relate to defects in the structure, the absence of a specific part of the structure, or the presence of an unwanted structure on the substrate or on the wafer.

The invention claimed is:

1. An assembly for collimating broadband radiation, the assembly comprising:
 a convex refractive singlet lens having a first spherical surface for coupling the broadband radiation into the lens and a second spherical surface for coupling the broadband radiation out of the lens, wherein the first and second spherical surfaces have a common center; and
 a mount configured to hold the convex refractive singlet lens at a plurality of discrete contact points having a centroid coinciding with the common center.

2. The assembly according to claim 1, wherein the convex refractive singlet lens comprises a low dispersion material.

3. The assembly according to claim 2, wherein the low dispersion material has an Abbe number above 80.

4. The assembly according to claim 2, wherein the low dispersion material is N-FK58 glass.

5. The assembly according to claim 1, wherein the mount is a kinematic mount.

6. The assembly according to claim 5, wherein the kinematic mount contacts the singlet lens at a plurality of contact points and wherein the singlet lens is positioned inside the mount such that a centroid of the contact points of the kinematic mount coincides with the center of the first and second spherical lens surfaces.

7. The assembly according to claim 5, wherein the kinematic mount contacts the singlet lens at three locations.

8. The assembly according to claim 1, wherein the mount contacts the singlet lens in an equatorial plane of the singlet lens.

9. The assembly according to claim 1, wherein the mount comprises a plurality of leaf spring contacts urged into contact with the convex refractive singlet lens.

10. The assembly according to claim 1, further comprising a coupling refractive lens configured to couple the collimated radiation into a fiber.

11. The assembly according to claim 10, wherein the convex refractive singlet lens has first dispersive properties and wherein the coupling refractive lens has second dispersive properties configured to correct at least partially the first dispersive properties.

12. The assembly according to claim 10, wherein the coupling refractive lens is a chromatic doublet lens.

13. The assembly according to claim 12, wherein the chromatic doublet lens has a front lens element configured to couple the broadband radiation into the lens, and a back lens element configured to couple the broadband radiation out of the lens.

14. The assembly according to claim 13, wherein the front lens element has a biconvex shape, and wherein the back lens element has a positive meniscus shape.

15. The assembly according to claim 13, wherein the front lens element and the back lens element of the chromatic doublet lens are attached to each other with an adhesive.

16. The assembly according to claim 1, wherein the broadband radiation comprises radiation with wavelengths in the range of 400 nm to 2400 nm.

17. A radiation source comprising:
the assembly according to claim 1;
a broadband radiation source configured to provide radiation to the assembly; and
a fiber configured to collect and output broadband radiation.

18. A convex refractive singlet lens for use in an assembly according to claim 1, the convex refractive singlet lens having a first spherical surface configured to couple broadband radiation into the lens and a second spherical surface configured to couple broadband radiation out of the lens, wherein the first and second spherical surfaces have a common center, and wherein the lens comprises a low dispersion refractive material having an Abbe number above 80.

19. An inspection apparatus comprising the radiation source according to claim 17.

20. A lithographic apparatus comprising the radiation source according to claim 17.

21. An assembly for collimating broadband radiation, the assembly comprising:
a convex refractive singlet lens having a first spherical surface for coupling the broadband radiation into the lens and a second spherical surface for coupling the broadband radiation out of the lens, wherein the first and second spherical surfaces have a common center and the convex refractive singlet lens comprises a material having an Abbe number above 80; and
a mount configured to hold the convex refractive singlet lens.

* * * * *